United States Patent [19]

Takeshita

[11] Patent Number: 5,362,550
[45] Date of Patent: Nov. 8, 1994

[54] THIN FILM CIRCUIT BOARD AND ITS MANUFACTURING PROCESS

[75] Inventor: Shuji Takeshita, Kawasaki, Japan
[73] Assignee: Fujitsu Limited, Kawasaki, Japan
[21] Appl. No.: 19,565
[22] Filed: Feb. 18, 1993
[30] Foreign Application Priority Data Feb. 19, 1992 [JP] Japan ................................ 4-031239

[51] Int. Cl.⁵ .............................................. B32B 9/00
[52] U.S. Cl. ..................................... 428/209; 528/353
[58] Field of Search ........................ 428/209; 528/353

[56] References Cited

U.S. PATENT DOCUMENTS 3,770,573  11/1973  Dunphy et al. ...................... 161/227
4,937,133   6/1990  Watanabe et al. ................... 428/209
5,196,500   3/1993  Kreuz et al. ........................ 528/125

Primary Examiner—Patrick J. Ryan
Assistant Examiner—Kam F. Lee
Attorney, Agent, or Firm—Staas & Halsey

[57] ABSTRACT

A thin film circuit board has an insulator layer and a conductor layer embedded in the insulator layer and supported in an undercut state by an insulator. The entire conductor layer, excluding the portion supported by the insulator, is surrounded by an insulator having a relatively low dielectric constant which in turn is surrounded by an insulator having a relatively high dielectric constant. The insulator portion that supports the conductor layer in the undercut state has a relatively high etching rate and is formed in a desired thickness on an insulator layer having a relatively low etching rate.

10 Claims, 6 Drawing Sheets

THIN FILM CIRCUIT BOARD AND ITS MANUFACTURING PROCESS

BACKGROUND OF THE INVENTION

1. Field of the Invention

The present invention relates to a thin film circuit board and its manufacturing process, wherein the circuit board is formed so that the periphery of a conductor layer arranged on an insulator layer is covered by an insulator having a low dielectric constant.

2. Description of the Related Art

In response to increasing speeds of electronic apparatuses such as mainframe computers, in recent years, the signal propagation speed of conductor layers in circuit boards used in these electrical apparatuses has been made increasingly faster.

Since the signal propagation speed of the conductor layer in these circuit boards is subject to the dielectric constant effect of the insulator layer that supports this conductor layer, it is desirable that the insulator layer be formed by an insulator having a low dielectric constant in order to increase the signal propagation speed.

An example of the prior art is illustrated in the schematic drawing of the prior art of FIGS. 5 and 6a-6e. FIG. 5 is a lateral cross-sectional view, while FIGS. 6a through 6e are drawings of successive steps in the manufacturing process.

As indicated in FIG. 5, a thin film circuit board 9 is formed by arranging conductor layer 1, composed of a thin film that propagates signals and two insulator layers 10 and 11 formed between ground patterns 12 and 13. In addition, the dielectric constant of conductor layer 1 is was minimized as much as possible by providing an insulator layer 5 having a low dielectric constant, around the periphery of conductor layer 1.

When forming this type of thin film circuit board 9, a prescribed pattern is first formed on upper layer 10A of insulator layer 10 composed of a polyimide material deposited on ground pattern 12, as indicated in FIG. 6a. For example, a conductor layer composed of a good conducting material, such as aluminum or copper having a thickness of several $\mu$m is formed, followed by etching of insulator layer 10. As a result, undercut portion 6, having a width H1 and a depth H2, is formed between conductor layer 1, on both sides thereof and upper surface 10A of insulator layer 10, as indicated in FIG. 6b.

Next, as indicated in FIG. 6c, a coating of a low dielectric constant insulator 5, such as Teflon and so forth, is formed around the periphery of conductor layer 1, and conductor layer 1, coated with low dielectric constant insulator 5, is deposited so as to be covered by polyimide insulator layer 11 as indicated in FIG. 6d.

Finally, as indicated in FIG. 6e, ground pattern 13 is formed on upper surface 11A of insulator layer 11, thereby resulting in the formation of thin film circuit board 9.

Thus, as a result of nearly entirely covering the periphery of conductor layer 1 with low dielectric constant insulator 5, the dielectric constant of conductor layer 1 is minimized, as much as possible.

However, although it is possible to increase the size of the undercut portion 6 in the direction of depth H2 as indicated in FIG. 6b of lengthening the etching time, there is a limit on increasing that size in the direction of H1, since it is not possible to make said direction of H1 larger by lengthening the etching time.

Thus, when simply performing an etching, the value of width H1 decreases and the surface area of conductor layer 1, that low dielectric constant insulator 5 covers, also decreases. In actuality, the reduction in the dielectric constant of conductor layer 1 is lowered, thus resulting in a reduced increase in signal propagation speed, which is a problem.

SUMMARY OF THE INVENTION

Figure 1A:
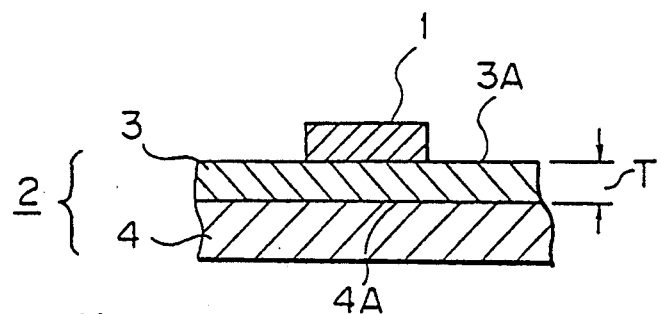
FIGS. 1a and 1b are schematic drawings illustrating a first embodiment of the invention.

The object of the present invention is to provide a thin film circuit board having an undercut portion of a prescribed size between a conductor layer and an insulator layer, and to provide a process by which this type of undercut portion can be reliably formed.

Thus, according to a first embodiment of the present invention, a thin film circuit board is provided comprising: an insulator layer and a conductor layer embedded in the insulator layer; the conductor layer being supported in an undercut state by an insulator; the entire conductor layer, excluding the portion supported by the insulator, being surrounded with an insulator having a relatively low dielectric constant; and, this relatively low dielectric constant insulator being surrounded with an insulator having a relatively high dielectric constant; wherein, the insulator portion that supports the above-mentioned conductor layer in the undercut state contains an insulator layer having a relatively high etching rate formed at a prescribed thickness on an insulator layer having a relatively low etching rate.

This thin film circuit board can be manufactured by a method including: forming an insulator layer having a relatively high etching rate at a prescribed thickness on an insulator layer having a relatively low etching rate and relatively high dielectric constant; arranging a conductor layer on said insulator layer having a relatively high etching rate; selectively removing the insulator having a relatively high etching rate, excluding a prescribed portion located beneath the conductor layer, by etching; forming an insulator portion that contains the insulator layer having a relatively high etching rate and supports the above-mentioned conductor layer in the undercut state; forming an insulator layer having a relatively low dielectric constant so as to surround the entire conductor layer; and, forming an insulator layer having a relatively high dielectric constant on top of the insulator layer having a relatively low dielectric constant so as to surround said entire insulator layer having a relatively low dielectric constant.

In addition, according to a second embodiment of the present invention, a thin film circuit board is provided comprising: an insulator layer and a conductor layer embedded in this insulator layer; the conductor layer being supported in an undercut state by an insulator; the entire conductor layer, excluding the portion supported by the insulator, being surrounded with an insulator having a relatively low dielectric constant; and, the relatively low dielectric constant insulator being surrounded with an insulator having a relatively high dielectric constant; wherein, the insulator portion that supports the above-mentioned conductor layer in the undercut state is formed at a prescribed thickness on a barrier layer.

The thin film circuit board according to the second embodiment the present invention can be manufactured by a method including: forming a barrier layer on an insulator layer having a relatively high dielectric constant; forming a second insulator layer at a prescribed thickness on the barrier layer; arranging a conductor layer on the second insulator layer; selectively removing the second insulator layer, excluding a prescribed portion located beneath the conductor layer, by etching; forming an insulator portion composed of the second insulator that supports the conductor layer in the undercut state; forming an insulator layer having a relatively low dielectric constant so as to surround the entire conductor layer; and, forming an insulator layer having a relatively high dielectric constant on top of the insulator layer having a relatively low dielectric constant so as to surround said entire insulator layer having a relatively low dielectric constant.

DESCRIPTION OF THE PREFERRED EMBODIMENTS

Figure 1B:
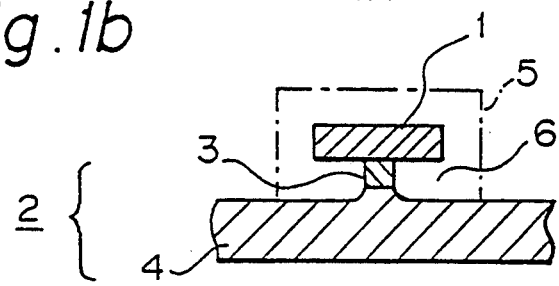
Figure 2A:
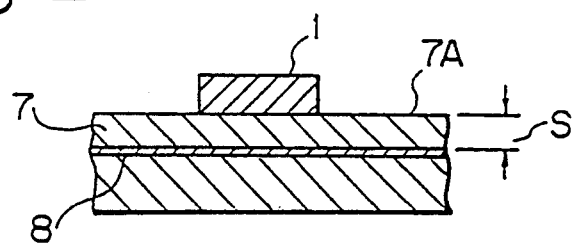
FIGS. 2a and 2b are schematic drawings illustrating a several embodiment of the invention.
Figure 2B:
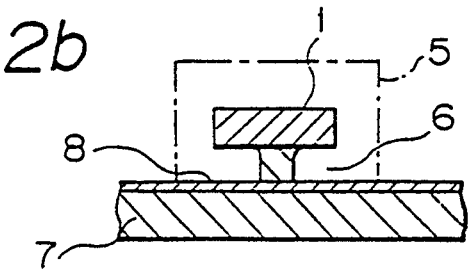

FIGS. 1a and 1b are schematic drawings illustrating the principle of a first embodiment of the invention, and FIGS. 2a and 2b are schematic drawings illustrating the principle of a second embodiment of the invention. As indicated in FIGS. 1a and b, insulator layer 2, on which is arranged conductor layer 1, is formed of a first layer 3 and second layer 4 having different etching rates. The first layer 3 is deposited on upper surface 4A of the second layer 4. As a result of etching said insulator layer 2, on which said conductor layer 1 is deposited on upper surface 3A of said first layer 3 thereof, the latter formed in a prescribed thickness T, an undercut portion 6 is formed which allows an enlarged lower surface extending inwardly from the periphery of said conductor layer 1 to be covered by low dielectric constant insulator 5 which thus extends between said enlarged lower surface of the conductor layer 1 and said insulator layer 2. In addition, the above-mentioned first layer 3 is formed by an insulator material having a high etching rate, while the above-mentioned second layer 4 is formed by an insulator material having a low etching rate.

Alternatively, as indicated in FIGS. 2a and 2b, barrier layer 8, being heat resistant and difficult to dissolve in an etching solution, is formed at an enlarged lower surface, extending inwardly insulator layer 7, on which conductor layer 1 is arranged on the upper surface 7A there. As a result of positioning said barrier layer 8 at interior-level location at a prescribed distance S from said upper surface 7A and etching said insulator layer 7, undercut portion 6 is formed, which allows an enlarged lower surface, extending inwardly the periphery of said conductor layer 1 to be covered by low dielectric constant insulator 5 and which this extends between said conductor layer 1 and said insulator layer 7. In addition, the above-mentioned barrier layer 8 is preferably formed from silicon dioxide $SiO_2$.

The above-mentioned problems are solved by this type of construction.

In other words, in the first embodiment, insulator layer 2 is formed of a first layer 3 comprising of an insulator material having a high etching rate, and a second layer 4 comprising of an insulator material having a low etching rate. As a result of etching, the upper surface 3A of said first layer 3, on which is arranged the conductor layer 1, is easily dissolved resulting in the reliable formation of undercut portion 6 of a prescribed size between conductor layer 1 and upper surface 3A of said first layer 3. In addition, in the second embodiment barrier layer 8 is formed at a prescribed location within insulator 7; said barrier layer being composed of, for example, silicon dioxide $SiO_2$, which has heat resistance and is difficult to dissolve in an etching solution. When the dissolving of upper surface 7A of insulator layer 7, on which conductor layer 1 is arranged, reaches barrier layer 8 as a result of etching, undercut portion 6 is reliably formed to a prescribed size between conductor layer 1 and upper surface 3A of first layer 3, since said dissolving proceeds in the above-mentioned direction H1.

In either case, the progression in direction H1 of undercut portion 6 formed etching can be made larger, allowing the formation of an undercut portion to a prescribed size. Thus, by increasing the surface area of the conductor layer 1 which is covered by low dielectric constant insulator 5, the signal propagation rate in conductor layer 1 can be increased.

In the above-mentioned description, examples of materials that are useful in forming an insulator layer having a high etching rate include the polyimide indicated in the following structural formula I, which is synthesized from pyromellitic dianhydride (PMDA) and 4,4′-diaminodiphenylether (DDE).

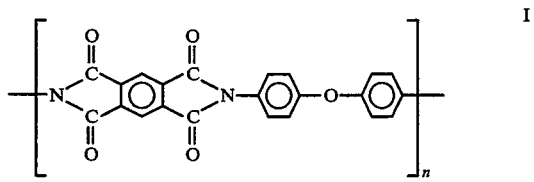

In addition, examples of a useful material for the formation of an insulator layer having a low etching rate include the polyimide indicated in the following structural formula II, which is synthesized from biphenyltetracarboxylic dianhydride (BPDA) and phenylenediamine (PDA).

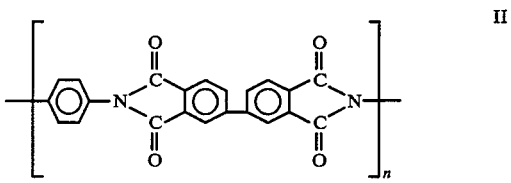

The following provides an explanation of an embodiment of the present invention while referring to FIGS. 3a–3f and FIGS. 4a–4d.

Figure 3A:
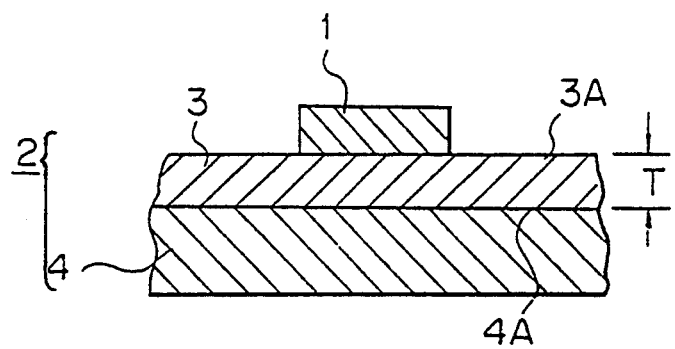
FIGS. 3a through 3f are schematic drawings illustrating the second embodiment of the invention.

As indicated in FIG. 3a, the above-mentioned polyimide of structural formula II having a low etching rate is first spin coated and pre-baked at 200° C. to form second layer 4. Next, the above-mentioned polyimide of structural formula I having a high etching rate is spin coated on top of the above-mentioned second layer 4 to form first layer 3. These layers are then baked while raising the temperature to 400° C. in an atmosphere of $N_2$ gas. Although both first layer 3 and second layer 4 can be baked by raising the temperature to 400° C. during their formation, using the above-mentioned procedure saves time, and it also has the advantage of not subjecting the layer beneath these layers, which have been previously formed, to unnecessary thermal stress. The film thickness of the resulting layer 3 is 3μ, and that of layer 4 is 20μ. Next, conductor layer 1 is formed on layer 3. The formation of conductor layer 1 can be done by conventional techniques. For example, after depositing Cr at a thickness of 1000 Å, Cu at a thickness of 3 μ and Cr at a thickness of 1000 Å over the entire surface of layer 3 by magnetron sputtering, this is then etched using a hot resist to obtain a conductor layer of the desired pattern.

Next, etching of insulator layer 2, composed of polyimide layers 3 and 4, is performed. Etching can be performed using a mixed solution of hydrazine and ethylenediamine (volume ratio 1:1) by heating to roughly 70° C. As a result, an etching rate of roughly 1 μm/minute is obtained with respect to layer 3.

Figure 3B:
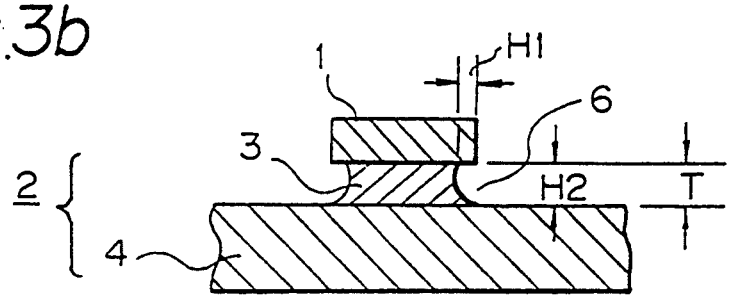

In FIG. 3b, dissolving of the polyimide by the etching solution proceeded to a location at which a portion of first layer 3 is removed resulting in an undercut portion 6, having a width H1 and depth H2, is between conductor layer 1 and insulator layer 2. The size of undercut portion 6 in the direction of H1 in this case is smaller than depth H2 because of the low etching rate in the direction of width H1.

Figure 3C:
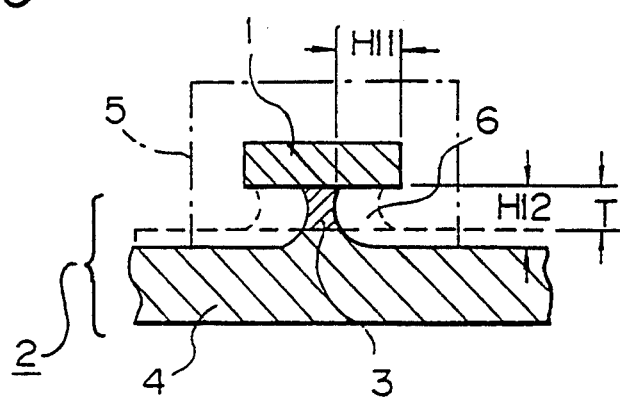

However, when etching is allowed to progress further so as to dissolve insulator layer 2 and the progression of the dissolving exceeds thickness T, shogun with a broken line, of first layer 3, as indicated in FIG. 3c, the width H1 of the undercut portion 6 increases to width H11 as a result of the progression of the dissolve of first layer 3 due to the high etching rate of said first layer 3 compared to the etching rate of second layer 4. Thus, as a result of the width of undercut portion 6 increasing to H11, and when thereafter covering conductor layer 1 with low dielectric constant insulator 5 in the next step, the surface of said conductor layer 1 can be covered over a wide range, thereby allowing the dielectric constant in conductor layer 1 to be lowered.

Figure 3D:
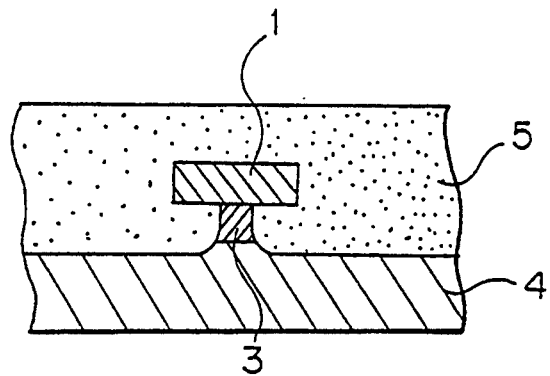

Next, as indicated in FIG. 3d, a layer of low dielectric constant insulator 5 is formed over the entire surface. This formation can be performed by, for example, spin coating a solution, in which perfluoroether elastomer is dissolved in a solvent, and then drying the solvent by applying a heat treatment.

Figure 3E:
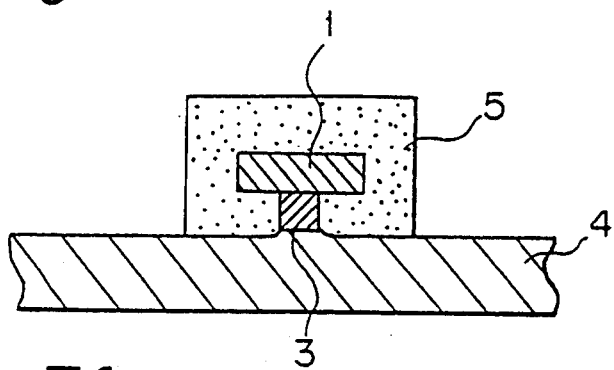
Figure 3F:
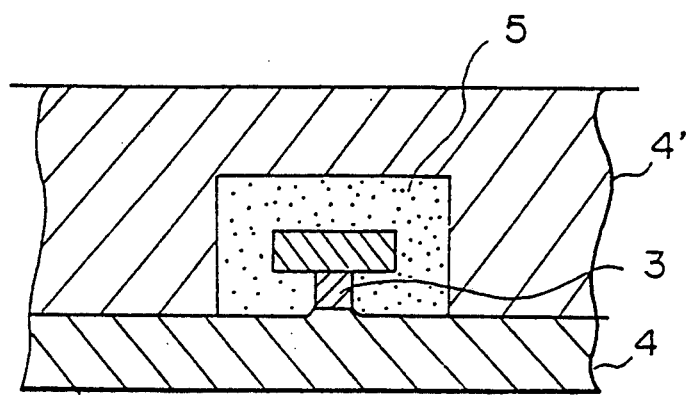

Moreover, as indicated in FIG. 3e, by etching the hot resist pattern in the form of a mask, low dielectric constant insulator 5 is removed, thereby resulting in the formation of a signal transmission path, in which conductor layer 1 is surrounded by low dielectric constant insulator 5. Next, a thin film circuit board is obtained by, for example, spin coating the above-mentioned polyimide of structural formula II over the entire surface and solidifying said polyimide by heating so as to further surround the layer of low dielectric constant insulator 5 with insulator layer 4', as indicated in FIG. 3f.

Figure 4A:
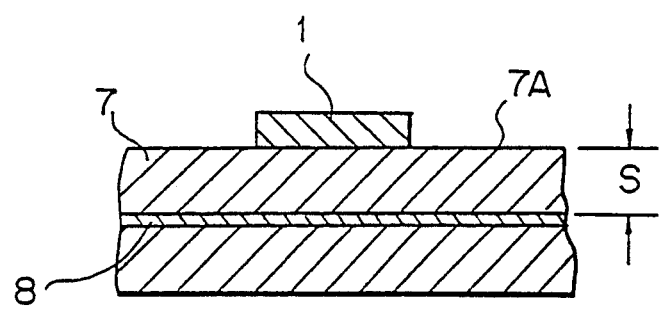
FIGS. 4a through 4d are schematic drawings illustrating the second embodiment of the invention.

Alternatively, as indicated in FIG. 4a, barrier layer 8, composed of a material that is difficult to dissolve in an etching solution, such as $SiO_2$, is provided in a thickness of roughly 1 μm on the intermediate portion, or interior level of insulator layer 7, on the surface 7A of which is arranged conductor layer 1. Insulator layer 1 is arranged on upper surface 7A of insulator layer 7, and barrier layer 8 is positioned at a location a prescribed distance S from upper surface 7A.

Figure 4B:
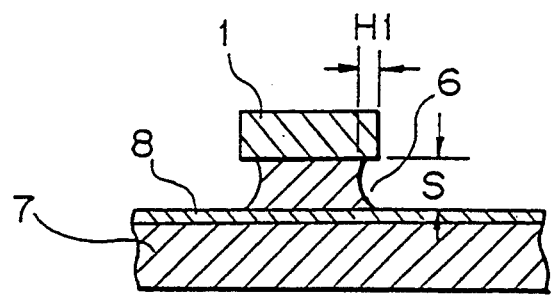
Figure 4C:
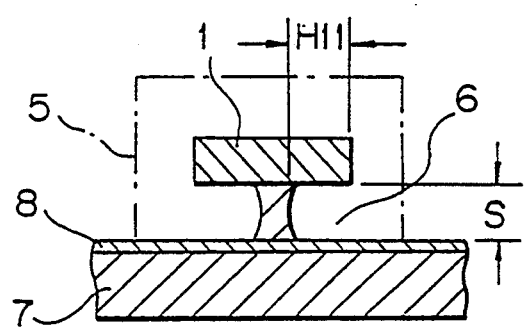

This being the case, insulator layer 7 is dissolved by an etching solution as a result of performing an etching of insulator layer 7, as indicated in FIG. 4b. When barrier layer 8 is thus exposed undercut portion 6, having a width H1 and depth S, is formed between conductor layer 1 and insulator layer 7.

The lateral size of undercut portion 6 in the direction H1 is smaller than depth S because of the low etching rate in the direction of width H1.

However, when the dissolving of insulator layer 7 by etching is allowed to progress further, the size of undercut portion 6 increases from width H1 to width H11 as a result of the progression of the dissolve of insulator layer 7 on the upper surface of barrier layer 8, thus allowing the size of said undercut portion 6 to be increased.

Thus, similar to the case described above, in the case of covering conductor layer 1 with low dielectric constant insulator 5 in the next step, the surface of said conductor layer 1 can be covered over a wide range, thereby allowing the dielectric constant in conductor layer 1 to be lowered.

Figure 4D:
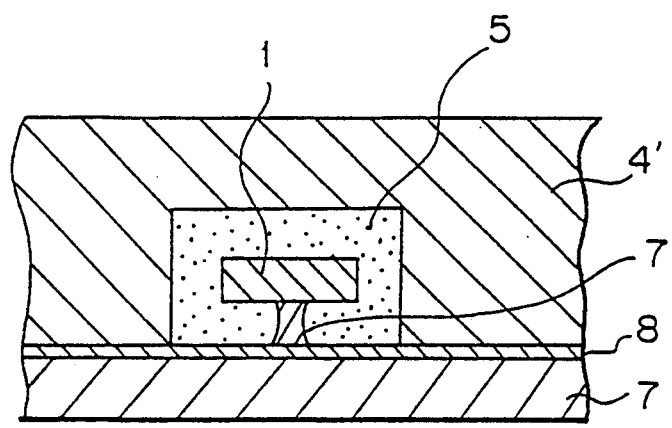
Figure 5:
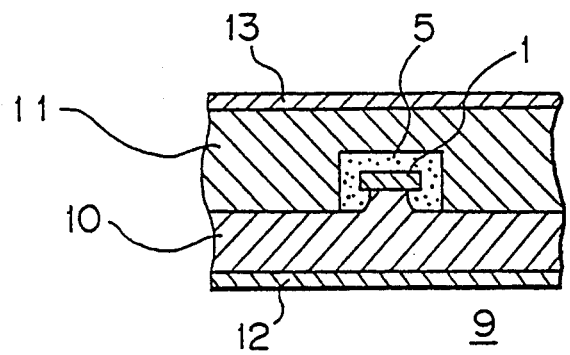
FIG. 5 is a schematic drawing illustrating an example of a thin film circuit board of the prior art.
Figure 6A:
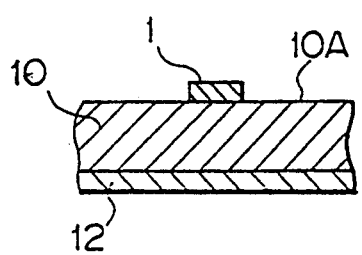
FIGS. 6a through 6e are schematic drawings illustrating the manufacturing process of the thin film circuit board of the prior art.
Figure 6B:
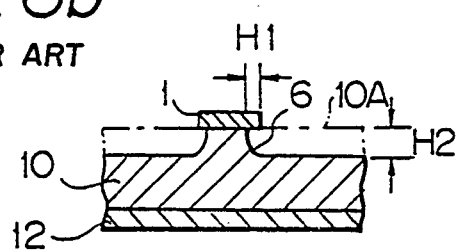
Figure 6C:
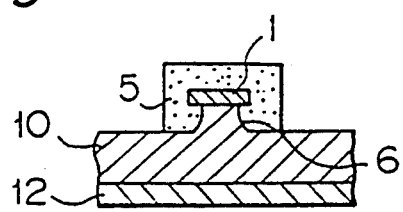
Figure 6D:
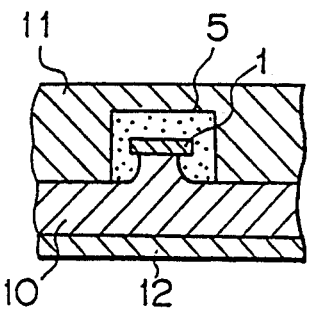
Figure 6E:
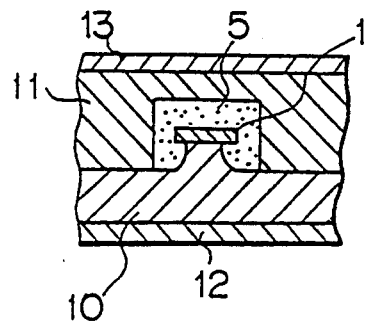

Then, by performing the procedure in the manner explained above with respect to FIGS. 3d–3f, a thin film circuit board can be obtained having a structure similar to that indicated in FIG. 4d.

Furthermore, if so desired, after forming the above-mentioned undercut portion, barrier layer 8, which is present beneath this undercut portion, may be removed by etching.

According to the present invention as explained above, an undercut portion having a prescribed size can be formed between an insulator layer and a conductor layer by etching, and the surface area of the of said conductor layer that is covered by a low dielectric constant insulator can be increased.

Thus, the dielectric constant in said conductor layer can be lowered so as to achieve an increase in signal propagation speed, thereby providing the present invention with a large practical advantage.

I claim:

1. A thin film circuit board comprising:
an insulator layer and a conductor layer embedded in the insulator layer; the conductor layer being supported in an undercut state by an insulator; the entire conductor layer, excluding the portion supported by the insulator, being surrounded with an insulator having a relatively low dielectric constant; and, the relatively low dielectric constant insulator being surrounded with an insulator having a relatively high dielectric constant; and the insulator portion that supports the conductor layer in the undercut state comprises an insulator layer having a relatively high etching rate formed in a desired thickness on an insulator layer having a relatively low etching rate.

2. A thin film circuit board as set forth in claim 1, wherein the insulator layer having a relatively high etching rate comprises a polyimide obtained from pyromellitic dianhydride and 4,4'-diaminodiphenylether.

3. A thin film circuit board as set forth in claim 1, wherein the insulator layer having a relatively low etching rate comprises a polyimide obtained from biphenyltetracarboxylic dianhydride and phenylenediamine.

4. A thin film circuit board comprising:

an insulator layer and a conductor layer embedded in the insulator layer; the conductor layer being supported in an undercut state by an insulator; the entire conductor layer, excluding the portion supported by the insulator, being surrounded with an insulator having a relatively low dielectric constant; the relativity low dielectric constant insulator being surrounded with an insulator having a relatively high dielectric constant; and the insulator portion that supports the conductor layer in the undercut state is formed in a desired thickness on a barrier layer.

5. A thin film circuit board as set forth in claim 4, wherein the barrier layer comprises $SiO_2$.

6. A thin film circuit board as a set forth in claim 4, wherein the insulator layer comprises a polyimide obtained from biphenyltetracarboxylic dianhydride and phenylenediamine.

7. A thin film circuit board comprising:

an insulator layer comprising an upper layer portion and a lower layer portion, each of the upper and lower layer portions having respective, substantially parallel upper and lower surfaces and the lower surface of the upper layer portion and the upper surface of the lower layer portion defining an interface therebetween, the upper layer portion being supported on the lower layer portion;

a conductor layer formed on the upper surface of the upper layer portion and having a pair of opposite edges spaced by a first dimension in a first direction, parallel to the respective upper and lower surfaces of the upper and lower layer portions;

the upper layer portion extending between and supporting the conductor layer on the lower layer portion of the insulator layer and comprising a pair of sidewalls spaced in the first direction by a second dimension, less than the first dimension, and respectively disposed inwardly of the pair of opposite edges of the conductor layer, each sidewall being spaced inwardly of the respective edge by a distance approximately equal to the thickness of the upper layer portion;

first, further insulating material, having a first dielectric constant, formed on the lower layer portion and on and surrounding the conductor layer and contacting the exposed upper and lower surfaces thereof and the pair of opposite edges thereof; and second, further insulating material, having a second, dielectric constant, formed on the interface and surrounding the first, further insulating material, the first dielectric constant being smaller than the second dielectric constant.

8. A thin film circuit board as recited in claim 7, wherein the upper and lower layer portions have respective, first and second etching rates, the first etching rate being higher than the second etching rate.

9. A thin film circuit board as recited claim 7, further comprising:

a barrier layer formed on the upper surface of the lower layer portion and defining the interface with the lower surface of the upper layer portion.

10. A thin film circuit board as recited in claim 9, wherein the barrier layer comprises $SiO_2$.

* * * * *

UNITED STATES PATENT AND TRADEMARK OFFICE
CERTIFICATE OF CORRECTION

PATENT NO. : 5,362,550

DATED : November 8, 1994

INVENTOR(S) : Shuji TAKESHITA

It is certified that error appears in the above-indentified patent and that said Letters Patent is hereby corrected as shown below:

Column 1, line 35, delete "was";

line 36, change "constant," to --constant--.

Column 2, line 15, change "several" to --second--.

Column 3, line 59, change "there" to --thereof.--.

Column 4, Formula I, change

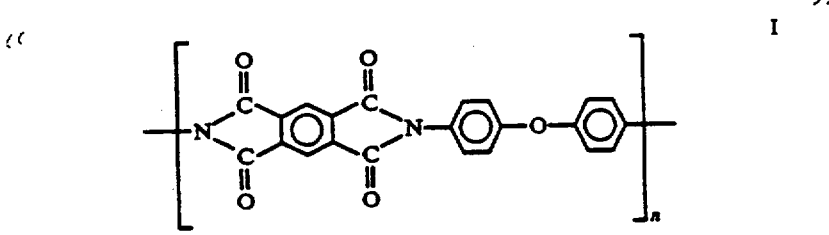

to

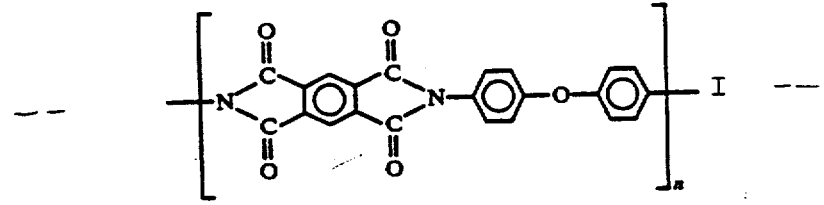

UNITED STATES PATENT AND TRADEMARK OFFICE
CERTIFICATE OF CORRECTION

PATENT NO. 5,362,550
DATED     November 8, 1994
INVENTOR(S) Shuji TAKESHITA

It is certified that error appears in the above-indentified patent and that said Letters Patent is hereby corrected as shown below:

Column 4, Formula II, change

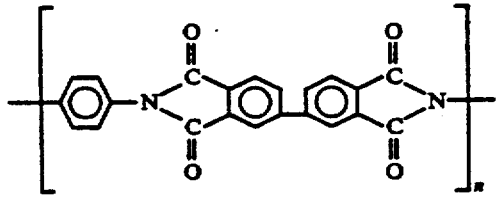

to

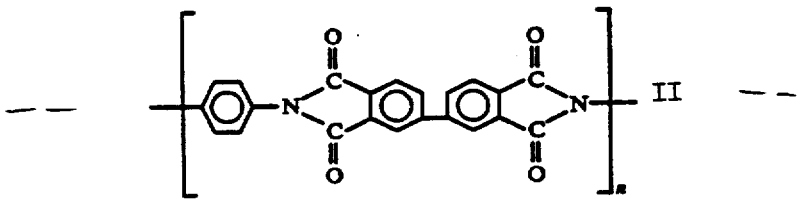

Column 5, line 27, change "proceeded" to
--has proceeded--;
line 29, delete "is";
line 39, change "dissolve" to --dissolving--.

UNITED STATES PATENT AND TRADEMARK OFFICE
CERTIFICATE OF CORRECTION

PATENT NO. : 5,362,550

DATED : November 8, 1994

INVENTOR(S) : Shuji Takeshita

It is certified that error appears in the above-indentified patent and that said Letters Patent is hereby corrected as shown below:

Column 6, line 19, change "dissolve" to --dissolving--.

Signed and Sealed this

Fourteenth Day of February, 1995

Attest:

BRUCE LEHMAN

Attesting Officer

Commissioner of Patents and Trademarks